United States Patent
Seningen et al.

(10) Patent No.: US 8,780,654 B2
(45) Date of Patent: Jul. 15, 2014

(54) WEAK BIT DETECTION IN A MEMORY THROUGH VARIABLE DEVELOPMENT TIME

(75) Inventors: Michael R. Seningen, Austin, TX (US); Michael E. Runas, McKinney, TX (US)

(73) Assignee: Apple Inc., Cupertino, CA (US)

( * ) Notice: Subject to any disclaimer, the term of this patent is extended or adjusted under 35 U.S.C. 154(b) by 126 days.

(21) Appl. No.: 13/443,170

(22) Filed: Apr. 10, 2012

(65) Prior Publication Data

US 2013/0265836 A1 Oct. 10, 2013

(51) Int. Cl.
*G11C 7/00* (2006.01)

(52) U.S. Cl.
USPC .......................................................... 365/194

(58) Field of Classification Search
USPC .......................................................... 365/194
See application file for complete search history.

(56) References Cited

U.S. PATENT DOCUMENTS

| | | | |
|---|---|---|---|
| 5,068,830 A | 11/1991 | Plants et al. | |
| 5,610,866 A | 3/1997 | McClure | |
| 6,006,339 A | 12/1999 | McClure | |
| 6,052,321 A | 4/2000 | Roohparvar | |
| 6,169,696 B1 | 1/2001 | Bissey | |
| 6,268,972 B1 | 7/2001 | Philpott et al. | |
| 6,363,001 B1 | 3/2002 | Borot et al. | |
| 6,574,159 B2 | 6/2003 | Ohbayashi et al. | |
| 6,611,448 B2 | 8/2003 | Nair et al. | |
| 6,885,600 B2 | 4/2005 | Tran et al. | |
| 7,164,612 B1 | 1/2007 | Eleyan et al. | |
| 7,184,337 B2 | 2/2007 | Versen | |
| 7,298,659 B1 | 11/2007 | Kengeri et al. | |
| 7,313,041 B1 | 12/2007 | Chapman et al. | |
| 7,642,620 B2 | 1/2010 | Tanaka | |
| 7,675,783 B2 * | 3/2010 | Park et al. | 365/185.24 |
| 7,724,584 B2 | 5/2010 | Lee | |
| 7,805,645 B2 | 9/2010 | Frey et al. | |
| 7,872,929 B2 * | 1/2011 | Dell et al. | 365/200 |
| 8,611,165 B2 | 12/2013 | Kazuno | |
| 2003/0107920 A1 | 6/2003 | Roohparvar | |
| 2003/0206435 A1 * | 11/2003 | Takahashi | 365/173 |
| 2006/0242386 A1 * | 10/2006 | Wood | 712/220 |

(Continued)

FOREIGN PATENT DOCUMENTS

KR 20030079078 10/2003

OTHER PUBLICATIONS

Paul Zuber, et al., "A Holistic Approach for Statistical SRAM Analysis," published in 47th ACM/IEEE Design Automation Conference (DAC), Jun. 13-18, 2010, pp. 717-722.

(Continued)

*Primary Examiner* — Hoai V Ho
*Assistant Examiner* — Min Huang
(74) *Attorney, Agent, or Firm* — Anthony M. Petro; Meyertons, Hood, Kivlin, Kowert & Goetzel, P.C.

(57) ABSTRACT

Embodiments of a memory are disclosed that may allow for the detection and compensation of weak data storage cells. The memory may include data storage cells, a selection circuit, a sense amplifier, and a timing and control block. The timing and control block may be operable to controllably select differing time periods between the activation of the selection circuit and the activation of the sense amplifier.

20 Claims, 14 Drawing Sheets

(56) References Cited

U.S. PATENT DOCUMENTS

| | | |
|---|---|---|
| 2008/0130385 A1* | 6/2008 | Chung .......................... 365/201 |
| 2009/0021996 A1 | 1/2009 | Versen et al. |
| 2009/0323446 A1 | 12/2009 | Zhang et al. |
| 2010/0246293 A1 | 9/2010 | Dudeck et al. |
| 2011/0116300 A1* | 5/2011 | Maejima ........................ 365/148 |
| 2012/0008384 A1 | 1/2012 | Li et al. |
| 2012/0069638 A1 | 3/2012 | Matsuda et al. |
| 2012/0230116 A1* | 9/2012 | Goda et al. ............... 365/185.25 |

OTHER PUBLICATIONS

Mohamed H. Abu-Rahma, et al., "A Methodology for Statistical Estimation of Read Access Yield in SRAMs," published in 45th ACM/IEEE Design Automation Conference (DAC), Jun. 8-13, 2008, pp. 205-210.

Mukhopadhyay et al., "Leakage Current Based Stabilization Scheme for Robust Sense-Amplifier Design for Yield Enhancement in Nano-scale SRAM," Proceedings of the 14th Asian Test Symposium (ATS '05), Dec. 18-21, 2005, pp. 176-181.

* cited by examiner

WEAK BIT DETECTION IN A MEMORY THROUGH VARIABLE DEVELOPMENT TIME

BACKGROUND

1. Technical Field

This invention is related to the field of memory implementation, and more particularly to sensing techniques.

2. Description of the Related Art

Memories typically include a number of data storage cells composed of interconnected transistors fabricated on a semiconductor substrate. Such data storage cells may store a single data bit or multiple data bits and may be constructed according to a number of different circuit design styles. For example, the data storage cells may be implemented as a single transistor coupled to a capacitor to form a dynamic storage cell. Alternatively, cross-couple inverters may be employed to form a static storage cell or a floating gate MOSFET may be used to create a non-volatile storage cell.

During the semiconductor manufacturing process, variations in lithography, transistor dopant levels, etc., may result in different electrical characteristics between transistors that are intended to have identical characteristics. This difference in electrical characteristics between transistors can result in data storage cells that output different small signal voltages for the same stored data. In a memory array, there may a large variation in the output voltages across the data storage cells that make up the memory array.

Data from storage cells that generate a smaller than average output signal due to the previously described variation may not be able to be read correctly, resulting in a misread. Data storage cells that fail to read properly may contribute to lower manufacturing yield and necessitate additional redundant data storage cells to maintain manufacturing yield goals.

SUMMARY

Various embodiments of a memory circuit are disclosed. In an embodiment, the memory circuit may include data storage cells, a column multiplexer, and a sense amplifier. The sense amplifier may be configured to amplify data from a selected data storage cell after a first or second time period from when the data storage cell was selected.

During operation, the strength of a data storage cell may be determined and the data stored in the cell amplified by the sense amplifier after a selected time interval from when the data storage cell is selected. Information indicative of the detected strength of the data storage cell may be stored and checked before amplifying data stored in the data storage cell.

BRIEF DESCRIPTION OF THE DRAWINGS

The following detailed description makes reference to the accompanying drawings, which are now briefly described.

Figure 1:
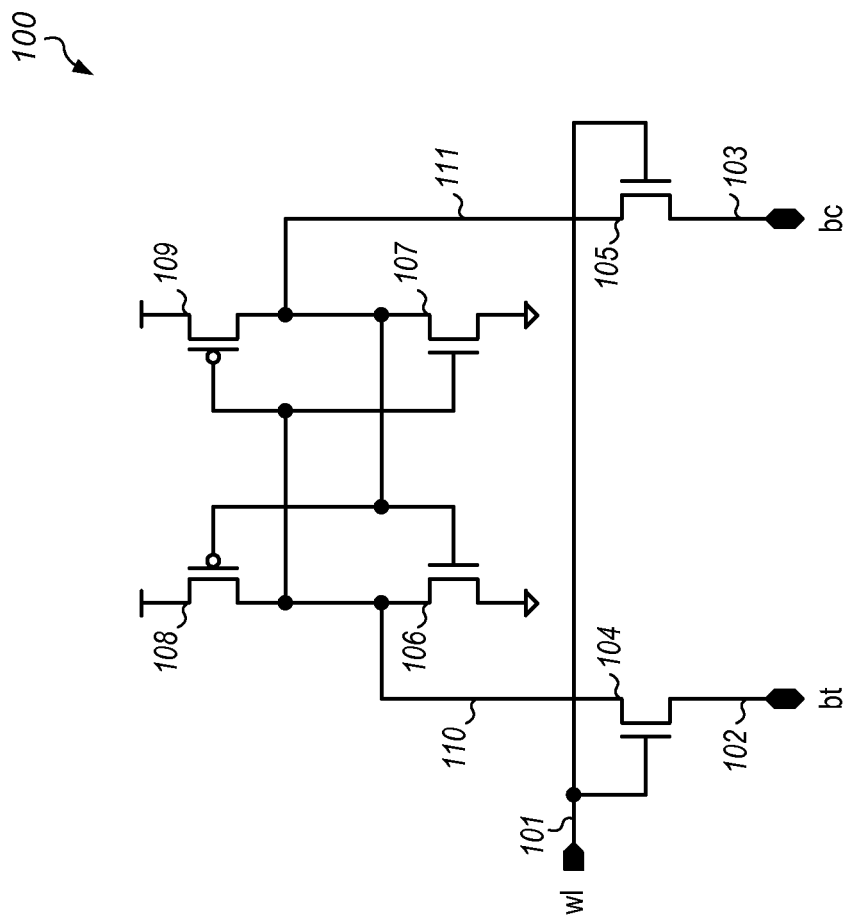
FIG. 1 illustrates an embodiment of a data storage cell.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component. More generally, the recitation of any element is expressly intended not to invoke 35 U.S.C. §112, paragraph six interpretation for that element unless the language "means for" or "step for" is specifically recited.

DETAILED DESCRIPTION OF EMBODIMENTS

During the manufacture of a semiconductor memory circuit, differences in lithography, implant levels, etc., may result in differences in electrical characteristics between data storage cells that are otherwise intended to be identical in characteristics and performance. In some cases, the variation of the electrical characteristics of a data storage cell may be sufficiently large that the data storage cell may not function (e.g., read or write) under normal operating conditions of the memory circuit, resulting in the data storage cell being identified as a failure and requiring replacement with a redundant data storage cell. Adding redundant data storage cells to the memory circuit to compensate for data storage cells with non-ideal electrical characteristics may result in additional chip area and power consumptions. The embodiments illustrated below may provide techniques to identify and compensate for data storage cells with non-ideal electrical characteristics.

FIG. 1 illustrates a data storage cell according to one of several possible embodiments. In the illustrated embodiment, data storage cell 100 includes a true I/O 102 denoted as "bt," a complement I/O denoted as "bc," and a selection input 101 denoted as "wl."

In the illustrated embodiment, bt 102 is coupled to selection transistor 104 and bc 101 is coupled to selection transistor 105. Selection transistor 104 and selection transistor 105 are controlled by wl 101. Selection transistor 104 is further coupled to pull-up transistor 108 and pull-down transistor 106 through node 110, and selection transistor 105 is further coupled to pull-up transistor 109 and pull-down transistor 107 through node 111. Pull-up transistor 108 and pull-down transistor 106 are controlled by node 111, and pull-up transistor 109 and pull-down transistor 107 are controlled by node 110.

It is noted that although selection transistors, pull-up transistors, pull-down transistors, and pre-charge transistors may be illustrated as individual transistors, in other embodiments, any of these transistors may be implemented using multiple transistors or other suitable circuits. That is, in various embodiments, a "transistor" may correspond to an individual transistor or other switching element of any suitable type (e.g., a field-effect transistor (FET)), or to a collection of transistors.

At the start of the storage operation true I/O 102 and complement I/O 103 may both be high and selection input 101 may be low. It is noted that in this embodiment, low refers to a voltage at or near ground potential and high refers to a voltage sufficiently large to turn on n-channel metal oxide field effect transistors (MOSFETs) and turn off p-channel MOSFETs. In other embodiments, other circuit configurations may be used and the voltages that constitute low and high may be different. During the storage, or write, operation, selection input 101 may be switched high which couples true I/O 102 to node 110 and complement I/O 103 to node 111. To store a logical 1 into data storage cell 100, complement I/O 103 may be switched to a low. Since selection transistor 105 is on, node 111 is also switched low. The low on node 111 activates pull-up transistor 108 which charges node 110 high. The high on node 110, in turn, activates pull-down transistor 107, which further reinforces the low on node 111 establishing regenerative feedback. Once this feedback between nodes 110 and 111 has been established, selection input 101 may be switched low turning off selection transistor 104 and selection transistor 105, isolating node 110 from true I/O 102 and node 111 from complement I/O 103. The method of storing a logical 0 may be similar. Selection input 101 may be switched high and true I/O 102 may be switched low. Selection transistor 104 couples the low on true I/O 102 to node 110, which activates pull-up transistor 109. The high on node 111 activates pull-down transistor 106, reinforcing the low on node 110 and establishing the regenerative feedback.

In the illustrated embodiment, data storage cell 100 outputs its stored data as the difference in voltage between true I/O 102 and complement I/O 103. (Data stored as the difference between two voltages may also be referred to herein as "differentially encoded".) At the start of the output process, true I/O 102 and complement I/O 103 are both high and selection input 101 is low. Asserting selection input 101 activates selection transistor 104 and selection transistor 105. If node 111 is low and node 110 is high, then a current will flow through selection transistor 105 and pull-down transistor 107 causing a reduction in voltage on complement I/O 103. If node 110 is low and node 111 is high, then a current will flow through selection transistor 104 and pull-down transistor 106 to causing a reduction in voltage on true I/O 102. For either data state, the current that the data storage cell sinks from either the true I/O 102 or complement I/O 103 is referred to as the read current of the data storage cell.

Ideally, the electrical characteristics of pull-down transistor 106 and pull-down transistor 107 would be identical, as would be the electrical characteristics of selection transistor 104 and selection transistor 105. Furthermore, in an ideal circuit, it might be desirable that pull-down transistor 106 and pull-down transistor 107 in one data storage cell in a memory device have identical electrical characteristics to pull-down transistor 106 and pull-down transistor 107 in another data storage cell in the memory device. However, during the semiconductor manufacturing process, differences in lithography, fluctuations in dopant levels, etc., may result in these transistors having different electrical characteristics (e.g., saturation current). Aging effects induced by, e.g., hot-carrier injection may also change a transistor's electrical characteristics over time. Variation, due to both manufacturing and aging effects, in pull-down transistor 106, pull-down transistor 107, selection transistor 104 and selection transistor 105 from one data storage cell to another may result in variation in read currents and, therefore, variation in output voltages for the same stored data.

In some cases, the variation in the electrical characteristics of the transistors may result in larger than average output voltages when the storage cell is read. Data storage cells that generate larger than average output voltages may be referred to as strong cells. In some cases, the variation in the electrical characteristic of the transistors may result in smaller than average output voltages when the storage cell is read. Data storage cells that generate smaller than average output voltages may be referred to as weak cells. If the value of the output voltage generated by a weak storage cell is sufficiently small, it may not be possible to properly determine the data stored in the data storage cell, because the output voltage may not be able to overcome imbalances and signal noise within a sense amplifier.

It is noted that the number of transistors and the connectivity shown in FIG. 1 are merely an illustrative example, and that in other embodiments, other numbers, types of transistors, and/or circuit configurations may be employed. It is also noted that in other data storage cell embodiments, other storage mechanisms may be employed. For example, a capacitor (as, e.g., in a dynamic random access memory (DRAM)), transistor implants (as, e.g., in a depletion programmable read-only memory (ROM)), or a floating gate structure (as in a single-bit or multi-bit non-volatile or flash memory) may be used to store data in a data storage cell.

Figure 2:
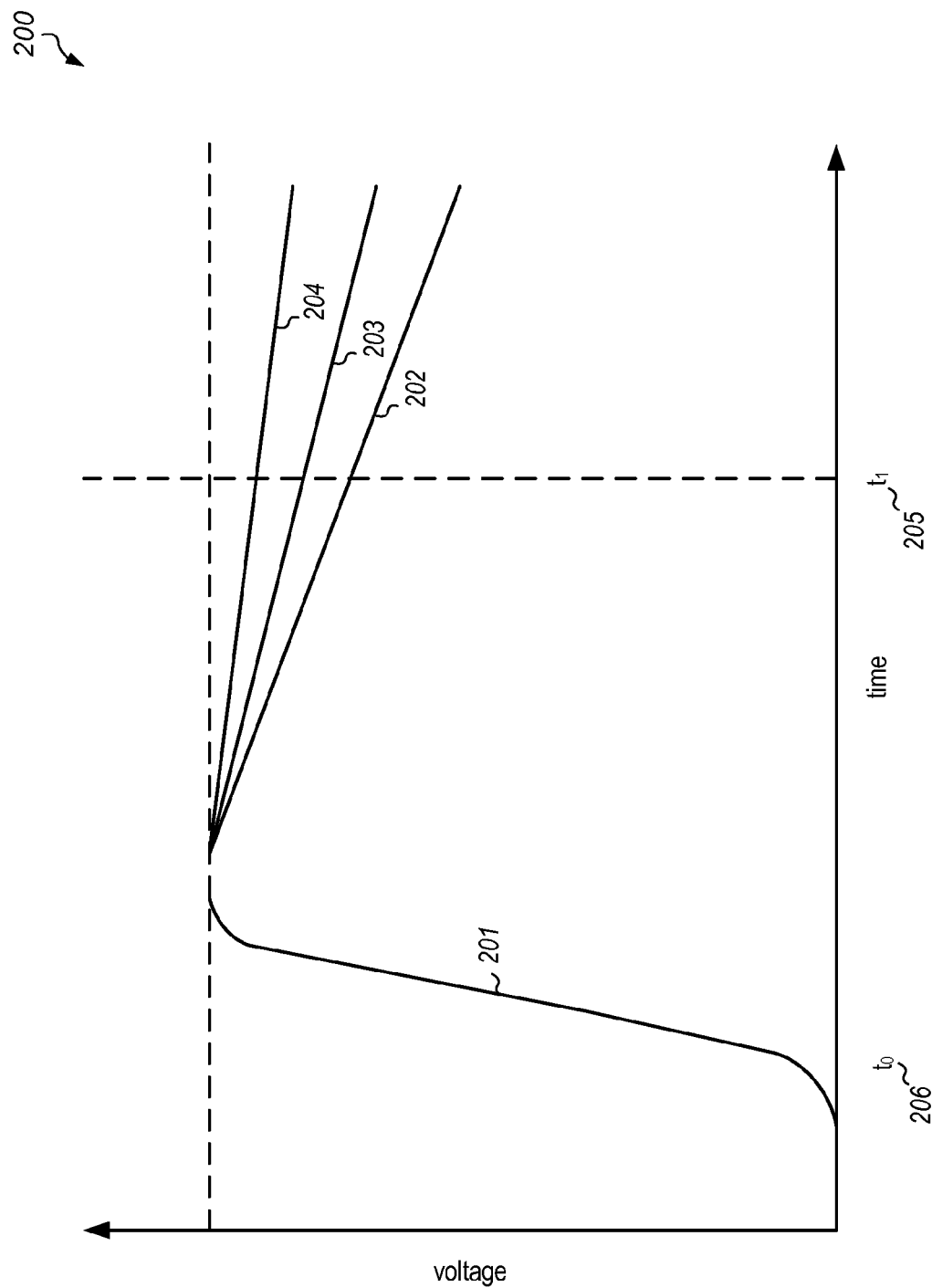
FIG. 2 illustrates possible waveforms for the discharge of bit lines.

FIG. 2 illustrates possible waveforms resulting from the operation of the embodiment of the data storage cell shown in FIG. 1. At time $t_0$ 206, the selection input 101 is asserted (waveform 201). Depending on the value of the stored data, either true I/O 102 or complement I/O 103 will begin to discharge (waveform 203). At time $t_1$ 205, the small signal differential between true I/O 102 and complement I/O 103 may be amplified by a sense amplifier. The system including one or more data storage cells may be modeled as a capacitor and current source. The capacitor represents the total capacitance present on true I/O 102 and complement I/O 103 which may include the junction capacitance of other data storage cells I/O ports and the capacitance of the interconnect between the data storage cells. The current source is the read current of the data storage cell. With this model, the voltage change on the low-going I/O from time $t_0$ to time $t_1$ can be estimated using equation 1.

$$v(t) = \frac{1}{C} \int_{t_0}^{t_1} i(t) dt \quad (1)$$

Over a limited range of time and voltages, the read current can be treated as a constant. This allows the equation to be simplified as shown in equation 2. For a constant load capacitance, the voltage change on the low going I/O is proportional to the read current of the data storage cell. If the read current of the data storage cell is less than average, then the change in voltage on the low going I/O will be less (waveform 204), resulting in a smaller differential voltage at the time the sense amplifier is activated. If the read current of the data storage cell is larger than average, then the change in voltage on the low going I/O will be greater (waveform 202) resulting in a larger differential at the time the sense amplifier is activated. It is noted that the waveforms shown in FIG. 2 are merely an illustrative example and that, in other embodiments, differing waveform behavior may be possible.

$$\Delta v = \frac{t_{read}}{C(t_1 - t_0)} \quad (2)$$

Figure 3:
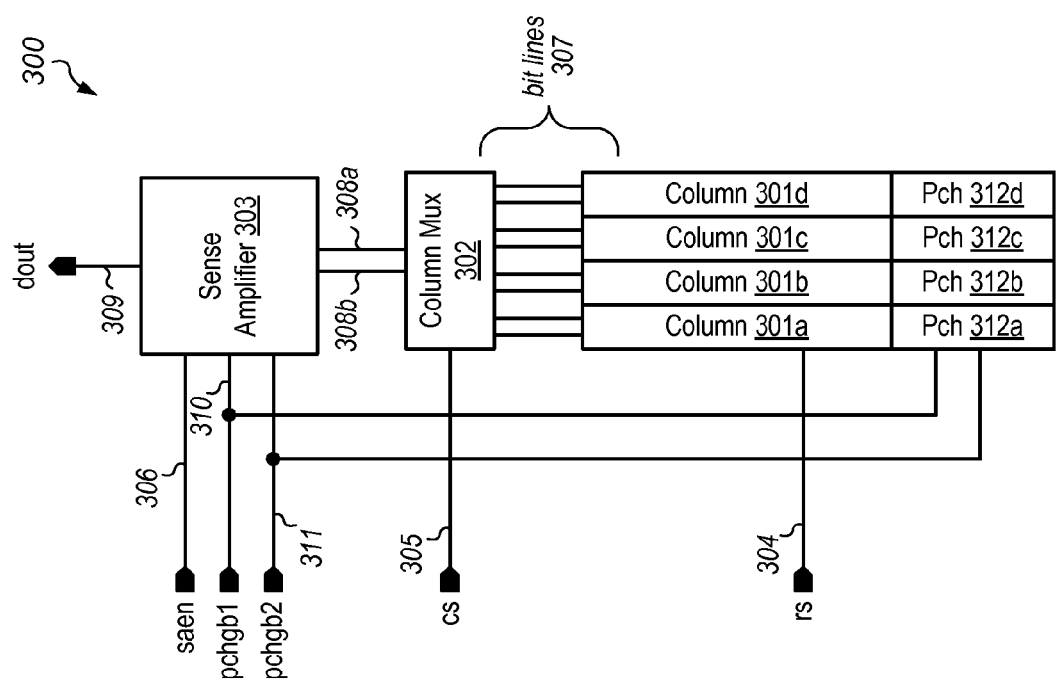
FIG. 3 illustrates an embodiment of a memory sub-array.

FIG. 3 illustrates an embodiment of a memory sub-array which includes a data output 311 denoted as "dout," a first pre-charge control input 310 denoted as "pchgb1," a second pre-charge control input 311 denoted as "pchgb2," and a sense amplifier enable input 306 denoted as "saen." The illustrated embodiment also includes one or more column selection inputs 305 denoted as "cs" and one or more row selection inputs 304 denoted as "rs."

In the illustrated embodiment, columns 301a, 301b, 301c, and 301d are coupled to the inputs of column multiplexer 302 through bit lines 307. The differentially encoded output of column multiplexer 302 is coupled to the differential inputs of sense amplifier 303 through nodes 308a and 308b, and the output of sense amplifier 303 is coupled to dout 309. Pre-charge circuits pch 312a, 312b, 312c, and 312d are coupled to columns 301a, 301b, 301c, and 301d through bit lines 307, and are controlled by pchgb1 310 and pchgb2 311.

Each column 301 may include one or more of data storage cell 100. For example, the individual bit lines bt 102 of each data storage cell 100 within a column 301 may be coupled together to form a true bit line 307 of column 301. Likewise, the individual bit lines be 103 of each data storage cell 100 within column 301 may be coupled together to form a complement bit line 307 of column 301. Individual word lines wl 101 of each data storage cell 100 within column 301 may be coupled to a respective one of row select signals rs 304 such that when a given rs 304 is asserted, the corresponding data storage cell 100 creates a differentially encoded output on the true bit line and complement bit line of column 301, while the bit line outputs of the remaining data storage cells 100 within column 301 remain quiescent. In other embodiments, the data storage cells may be dynamic storage cells, single-bit or multi-bit non-volatile storage cells, or mask programmable read-only storage cells. It is noted that in some embodiments, the data storage cell may transmit data in a single-ended fashion. In such cases, only a single bit line per column is required.

In some embodiments, column multiplexer 302 may contain one or more pass gates controllable by cs 305. The input of each pass gate may be coupled to the either the true or complement bit line output from one of columns 301a, 301b, 301c, and 301d. The output of each pass gate coupled to a true bit line is coupled to the true output of column multiplexer 302 in a wired-OR fashion, and the output of each pass gate coupled to a complement bit line is coupled to the complement output of column multiplexer 302 in a wired-OR fashion. In other embodiments, column multiplexer 302 may contain one or more logic gates configured to perform the multiplexer selection function.

Sense amplifier 303 may use analog amplification techniques in some embodiments. In other embodiments, sense amplifier 303 may employ a latch-based amplification technique.

Figure 4:
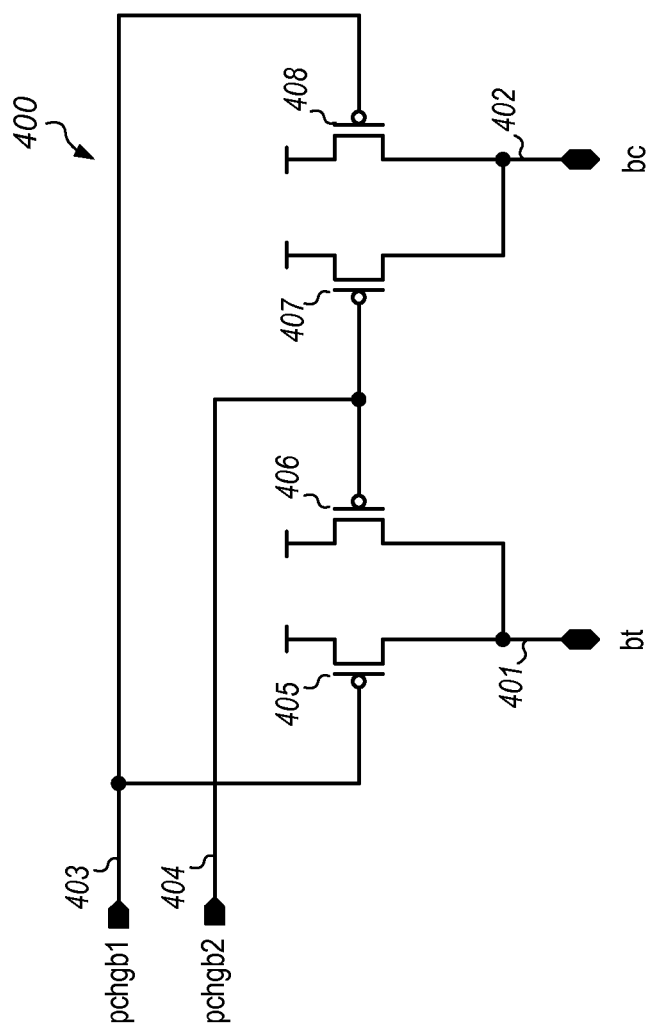
FIG. 4 illustrates an embodiment of a pre-charge circuit.

FIG. 4 illustrates an embodiment of a pre-charge circuit that may be used with a memory sub-array. The illustrated embodiment includes a true bit line port 401 and a complement bit line port 402, respectively denoted as "bt" and "bc." The embodiment further includes a first pre-charge control input 403 and a second pre-charge control input 404, respectively denoted as "pchgb1" and "pchgb2." In some embodiments, true bit line port 401 and complement bit line port 402 may correspond to bit lines 307 in sub-array 300. In other embodiments, first pre-charge control input 403 and second pre-charge control input 404 may respectively correspond to pchgb1 310 and pchgb2 311 of sub-array 300.

In the illustrated embodiment, bt 401 is coupled to pull-up transistors 405 and 406, and bc 402 is coupled to pull-up transistors 407 and 408. Pull-up transistors 405 and 408 are controlled by pchgb1 403, and pull-up transistors 406 and 407 are controlled by pchgb2 404. In some embodiments, pull-transistors 405, 406, 407, and 408 have the same transconductance. In other embodiments, pull-up transistors 405 and 408 may have the identical transconductance values, and pull-up transistors 406 and 407 may have the same transconductance that is larger than the transconductance of pull-up transistors 405 and 408.

During operation, pchgb1 403 may be set low and pchgb2 404 may be set high. Pull-up transistors 405 and 408 source current to bt 401 and bc 402, respectively, in response to pchgb1 being set low. In other embodiments, pchgb2 404 is set low and pchgb1 403 is set high, causing pull-up transistors 406 and 407 to source current to bt 401 and be 402, respectively. In some embodiments, pchgb1 403 and pchgb2 404 may both be set low simultaneously.

In some embodiments, the illustrated sub-array 300 may operate as follows. Referring collectively to FIG. 3, the flowchart illustrated in FIG. 5, and the waveforms illustrated in FIG. 6, the operation may start by initializing the sub-array (block 501) by setting pchgb1 310 low and pchgb2 311 high, and setting rs 304, cs 305, and saen 306 to inactive states. Once sub-array 300 has been initialized, pchgb 310 may be set high at $t_0$ 609 (waveform 601) and one of rs 304 may be asserted at time $t_1$ 610 (waveform 602), selecting a data storage cell in each of columns 301a, 301b, 301c, and 301d (block 502). One of cs 305 may then be asserted at time $t_2$ 611 (waveform 603), causing column multiplexer 302 to output data (block 503) selected from one of bit lines 307 (waveform 604).

The operation then depends on whether or not sub-array 300 is operating in test mode (block 504). When sub-array 300 is not operating in test mode, the operation depends on the strength of the selected data storage cell (block 505). The determination of the strength of the selected data storage cell may be the result of a comparison between an input address to a memory circuit and a predetermined set of addresses known to select weak data storage cells as will be described in reference to memory 700. When the selected data storage cell is not weak, the default signal development time is selected (block 506). Sense amplifier 303 is activated at time $t_3$ 612 and the available signal is amplified (differential 607) by sense amplifier 303 (block 507). Sub-array 300 is then re-initialized by de-asserting saen 306, and the asserted one of rs 304 and cs 305, and setting pchgb1 310 low (block 508).

When the selected data storage cell is weak, a longer signal development time may be selected (block 509). The activation of sense amplifier 303 is delayed to time $t_4$ 613 and the available signal (differential 608) is amplified by sense amplifier 303 (block 510). The additional time from $t_3$ 512 to $t_4$ 513 permits additional signal voltage to develop (the developed signal voltage is proportional to the development time as shown in equation 2), which may allow a weak data storage cell to be properly read. Once the signal has been amplified, sub-array 300 is then re-initialized by de-asserting saen 306, and the asserted one of rs 304 and cs 305, and setting pchgb2 311 low (block 511). In some embodiments, the additional developed signal may require the use of pull-up transistors in Pch 312a, 312b, 312c, and 312d with transconductance values sufficiently large to pre-charge bit lines 307 in the allotted portion of the memory access cycle.

Figure 5:
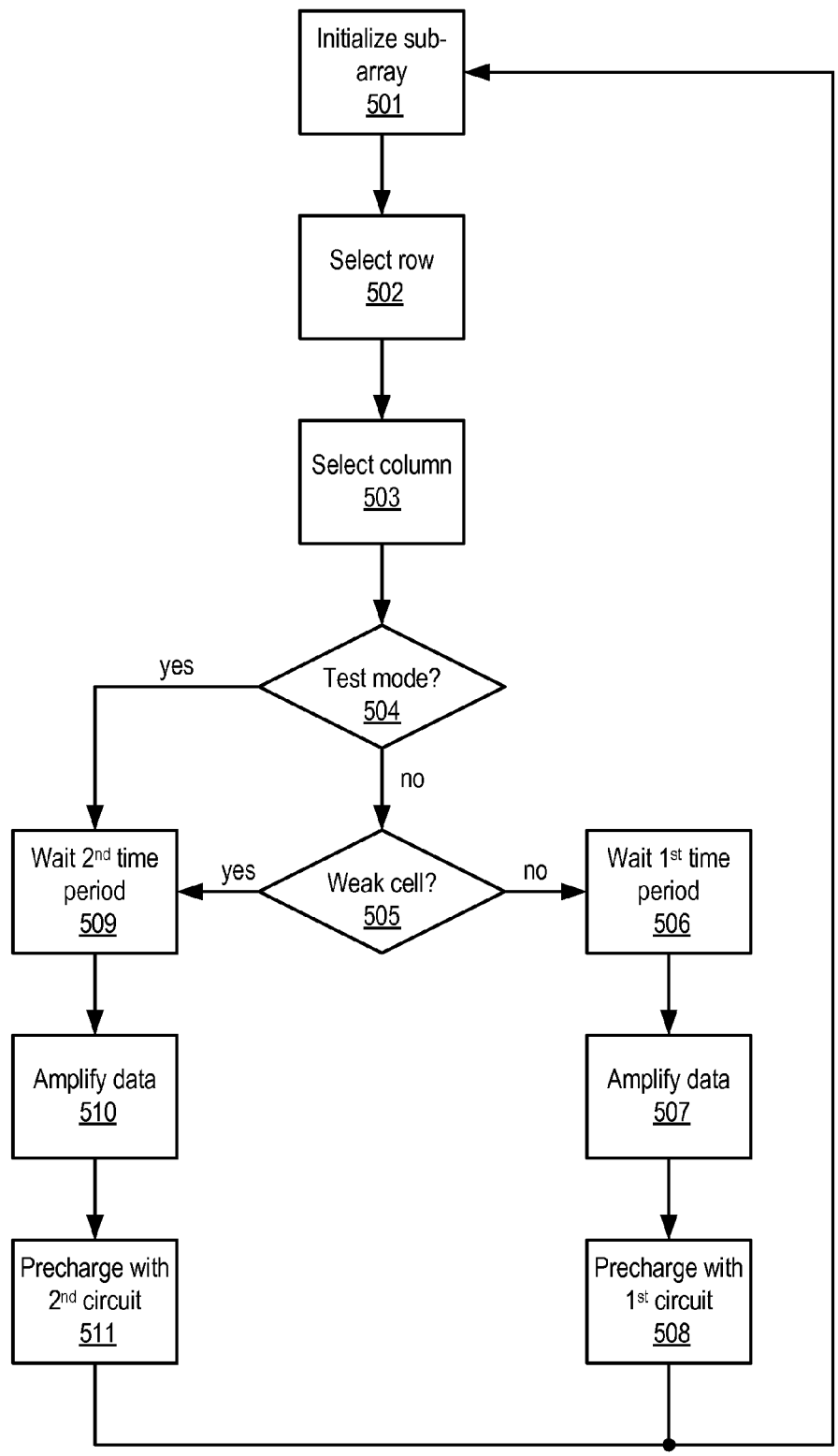
FIG. 5 illustrates a possible method of operating the embodiment illustrated in FIG. 3.
Figure 6:
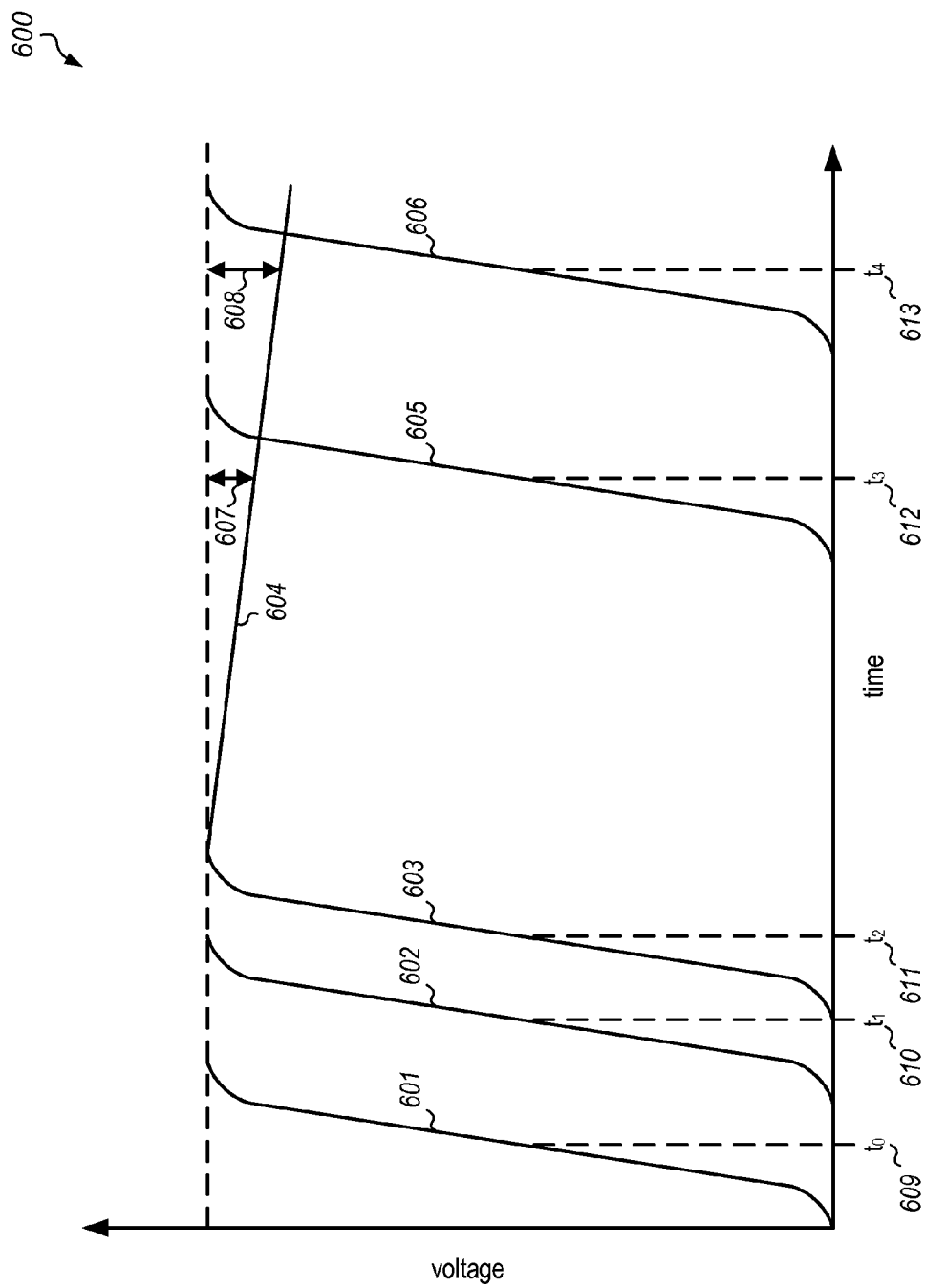
FIG. 6 illustrates possible waveforms during the operation of the embodiment illustrated in FIG. 3.

When sub-array 300 is in test mode, the activation of sense amplifier 303 is delayed to time $t_4$ 613 (block 509) and the available signal voltage (differential 608) is amplifier by sense amplifier 303 (block 510). As in the case when the selected data storage cell is weak, the additional time from $t_3$ 512 to $t_4$ 513 permits additional signal voltage to develop. Once the signal has been amplified, sub-array 300 is then re-initialized by de-asserting saen 306, and the asserted one of rs 304 and cs 305, and setting pchgb2 311 low (block 511). It is noted that the operations illustrated with respect to FIG. 5 are merely and illustrative example and that during actual circuit operation, the operations may occur in a different order.

Figure 7:
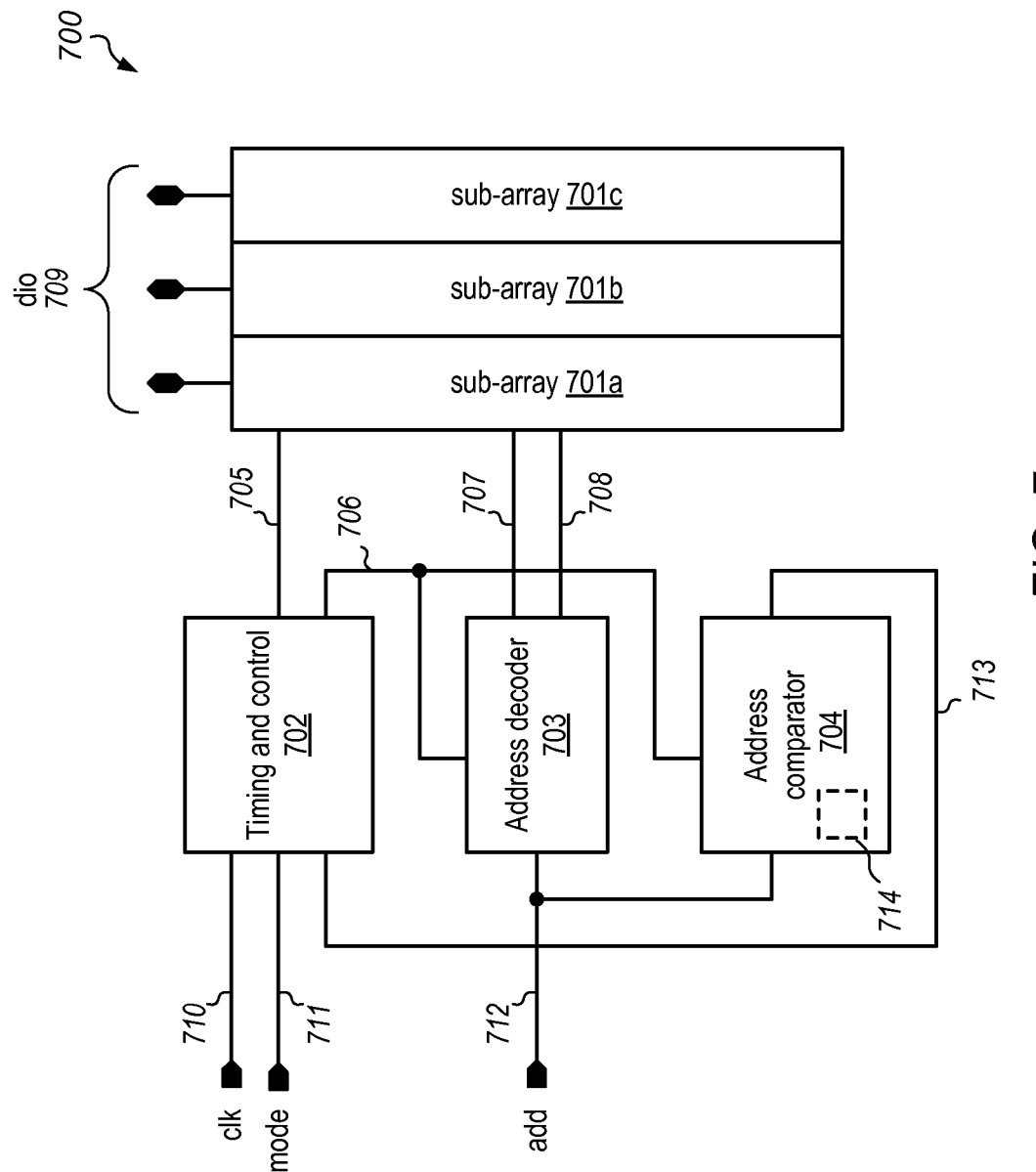
FIG. 7 illustrates an embodiment of a memory.

FIG. 7 illustrates a memory according to one of several possible embodiments. In the illustrated embodiment, memory 700 includes data I/O ports 709 denoted "dio," an address bus input 712 denoted "add," mode selection inputs 711 denoted "mode," and a clock input 710 denoted "clk."

In the illustrated embodiment, memory 700 includes sub-arrays 701a, 701b, and 701c, timing and control unit 702, address decoder 703, and address comparator 704. Sub-arrays 701a, 701b, and 701c may incorporate some or all of the features described above with respect to sub-arrays 300. Timing and control unit 702 is coupled to provide a decoder enable signal 706 to address decoder 703 and address comparator 704, and control signals 705 to sub-arrays 701a, 701b, and 701c.

Address decoder 703 is coupled to provide row selects 707 and column selects 708 to sub-arrays 701a, 701b, and 701c, in response to the assertion of decoder enable signal 706 and the address value on address bus 712. Address comparator 704 is coupled to provide misread indication signal 713 to timing and control unit 702 based upon a comparison of the address value on add 712 to a collection of address values previously determined to select weak data storage cells in sub-arrays 701a, 701b, and 701c. In some embodiments, address comparator 704 may include a storage unit 714 configured to store the address location of weak data storage cells. Timing and control unit 702 provides the control signals 705 to operate sub-arrays 701a, 701b, and 701c, as well as enable address decoder 703 and address comparator 704. In some embodiments, control signals 705 may include a sense amplifier enable signal, a first pre-charge control signal, and a second pre-charge control signal. In other embodiments, the generation of control signals 705 within timing and control unit 702 may be dependent on misread indication signal 713.

Figure 8:
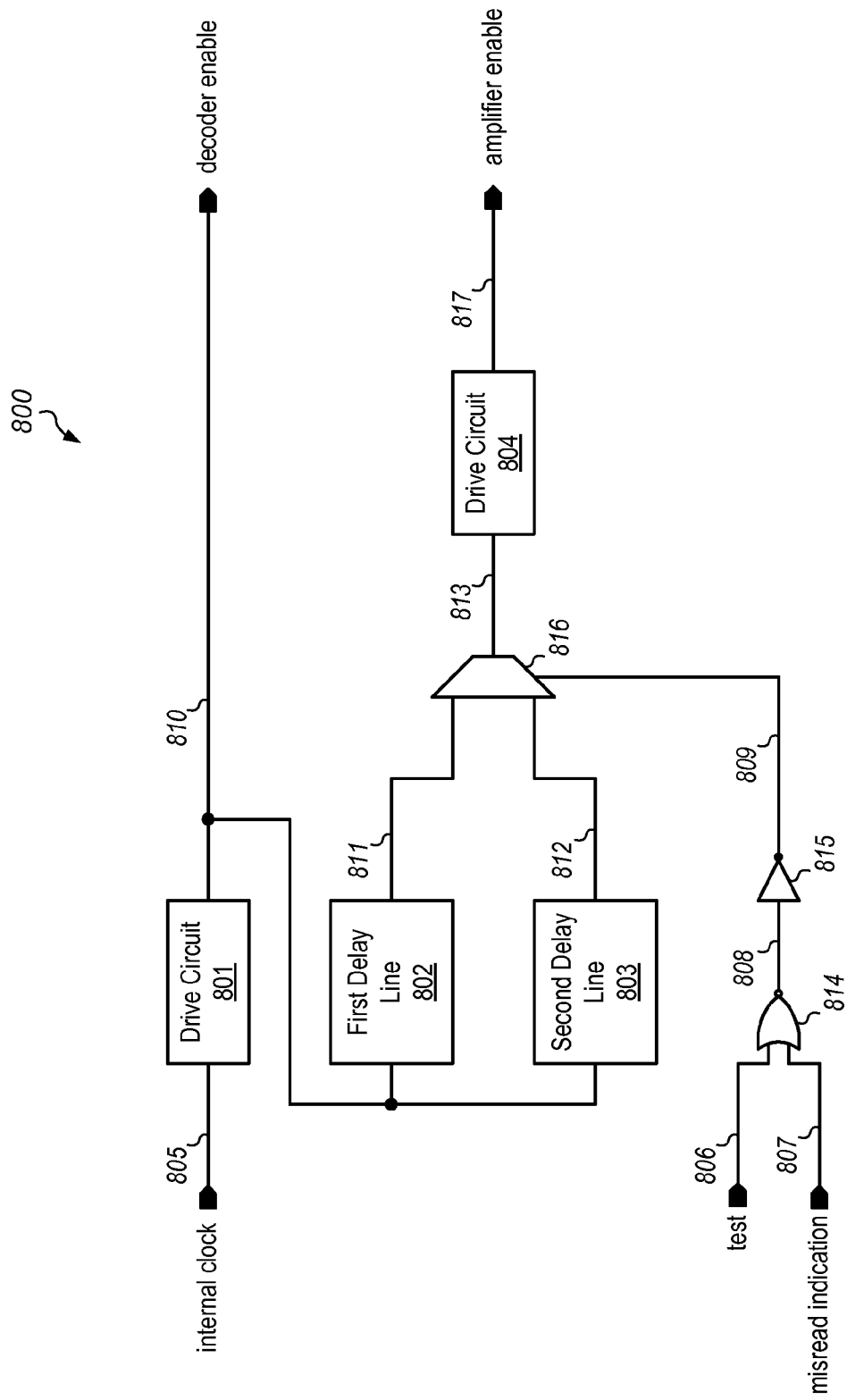
FIG. 8 illustrates an embodiment of a portion of a timing and control block.

FIG. 8 illustrates a possible embodiment of enable generator 800 that may be included in timing and control unit 702 of FIG. 7. In the illustrated embodiment, enable generator 800 is configured to generate a decoder enable 810 and an amplifier enable 817 which, in some embodiments, may correspond to decoder enable signal 706 and one of control signals 705 of FIG. 7, respectively. Additionally, the illustrated embodiment is configured to receive a misread indication signal 807 which, in some embodiments, may correspond to misread indication signal 713 of FIG. 7.

In the illustrated embodiment, internal clock 805 is coupled to drive circuit 801. The output of drive circuit 801 is coupled to decoder enable 810 and to the input of first delay line 802 and second delay line 803. The output of first delay line 802 and the output of second delay line 803 are coupled to the inputs of multiplexer 816. The output of multiplexer 816 is coupled to the input of drive circuit 804 and the output of drive circuit 804 is coupled to amplifier enable 817. Test signal 806 and misread indication signal 807 are coupled to the inputs of NOR gate 814, which is further coupled to inverter 815. The output of inverter 815 is coupled to the control input of multiplexer 816.

It is noted that static CMOS inverters and NOR gates, such as those shown and described herein, may be particular embodiments of inverting amplifiers that may be employed in the circuits described herein. However, in other embodiments, any suitable configuration of inverting amplifier that is capable of inverting the logical sense of a signal(s) and performing logical work may be used including inverting amplifiers built using technology other than CMOS.

It is also noted that in some embodiments, drive circuits 801 and 804 may include two or more inverters connected in series, each inverter increasing in drive strength such that the final inverter in the chain is of sufficient size to drive the intended load. In other embodiments, however, any other push-pull amplifier configuration may be employed.

In some embodiments, first delay line 802 and second delay line 803 may include two or more logic gates (e.g., inverters) connected in series. The logic gates may also include additional load devices (e.g., capacitors or inactive transistors) at each stage to increase the fanout of each stage, thereby increasing the delay per stage. In other embodiments, the logic gates may have a limited ability to source or sink current from their respective loads (this is commonly referred to as being "current starved"), which may also increase the delay per stage.

During operation, internal clock 805 may be asserted causing the drive circuit 810 to assert decoder enable 710. In response to the assertion of decoder enable 810, node 811 may be asserted after the time period of first delay line 802, and node 812 is asserted the time period of second delay line 803. In some embodiments, the delay generated by the second delay line 803 is larger than the delay generated by first delay line 802. The operation then depends on the state of test 806 and misread indication signal 807. When both test 806 and misread indication signal 807 are both low, NOR gate 814 may output a high on node 808 which may cause inverter 815 to output a high on node 809. The high on node 809 may cause multiplexer 816 to couple the node 811 to node 813. Drive circuit 804 may then assert amplifier enable 817 in response to the assertion of the signal on node 813.

When either test 806 or misread indication signal 807 is high, NOR gate 814 may output a low on node 808 which causes inverter 815 to output a high on node 809. The high on node 809 causes multiplexer 816 to couple node 812 to node 713. Driver circuit 804 may then assert amplifier enable 817 in response to the assertion of the signal on node 813.

Figure 9:
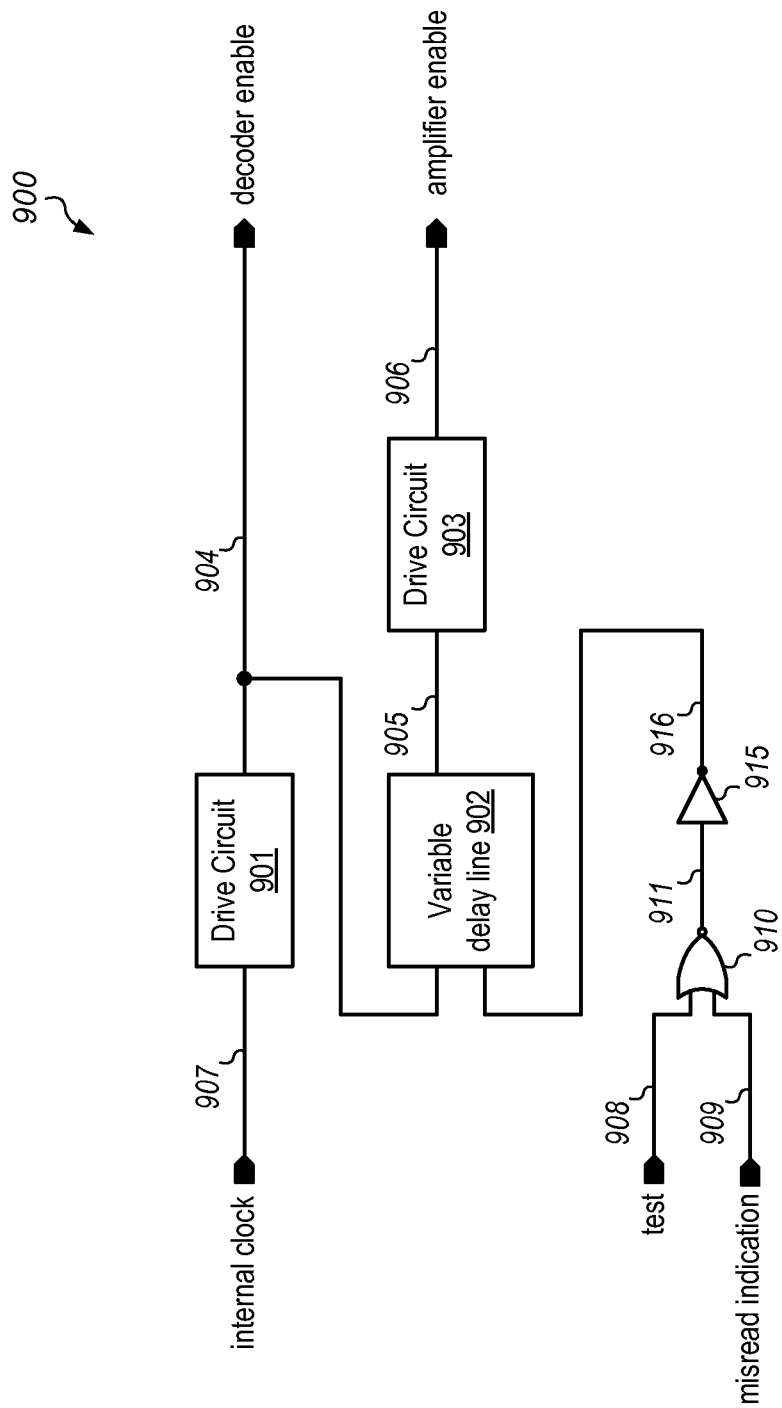
FIG. 9 illustrates an alternative embodiment of a portion of a timing and control block.

FIG. 9 illustrates a variant of an enable generator circuit employing a variable delay line, which may be used in some embodiments of timing and control unit 702 as an alternative to enable generator 800. In the illustrated embodiment, enable generator 900 includes input and output ports similar to enable generator 800: internal clock 907, test 908, misread indication signal 909, decoder enable 904, and amplifier enable 906. As with enable generator 800, decoder enable 904 and amplifier enable 906 may correspond to decoder enable signal 706 and one of control signals 705 of FIG. 7, respectively. Additionally, the illustrated embodiment is configured to receive a misread indication signal 909 which, in some embodiments, may correspond to misread indication signal 713 of FIG. 7.

In the illustrated embodiment, internal clock 907 is coupled to the input of drive circuit 901, which is further coupled to decoder enable 904. Decoder enable 904 is further coupled to the input of variable delay line 902. The output of variable delay line 902 is coupled to drive circuit 903 through node 905. Drive circuit 903 is, in turn, coupled to amplifier enable 906. Test 908 and misread indication signal 909 are coupled to the inputs of NOR gate 910 which is further coupled to the input of inverter 915. The output of inverter 915 is coupled to the control input of variable delay line 902.

In some embodiments, variable delay line 902 may include two or more current starved inverters connected in series and the output of inverter 915 may select between two allowable current levels for each of the inverters. In other embodiments, variable delay line 902 may include a bias circuit that is controllable by the output of inverter 915. A charge pump and digital-to-analog converter (DAC), collectively configured to provide the necessary voltage to the bias transistors in the current starved inverters, may also be included in some embodiments of variable delay line 902.

During operation, internal clock 907 may be asserted causing drive circuit 901 to assert decoder enable 904. The operation then depends on the state of test 908 and misread indication signal 909. When both test 908 and misread indication signal 909 are both low, NOR gate 910 may generate a high output on node 911, which causes inverter 915 to output a low on node 916. The low on node 916 may select a first delay in variable delay line 902. Variable delay line 902 responds to the assertion of decoder enable 904 by asserting a signal on node 915 after the selected first delay. Drive circuit 903 may then assert amplifier enable 906 is response to the assertion of the signal on node 915.

When either test 908 or misread indication signal 909 is high, NOR gate 910 may generate a low output on node 911, which causes inverter 915 to output a high on node 916. The high on node 916 selects a second delay in variable delay line 902. As in the previous case, variable delay line 902 may respond to the assertion of decoder enable 904 by asserting a signal on node 915 after the selected second delay. Drive circuit 903 then asserts amplifier enable 906 is response to the assertion of the signal on node 915. In some embodiments, the second delay is longer than the first delay.

Figure 10:
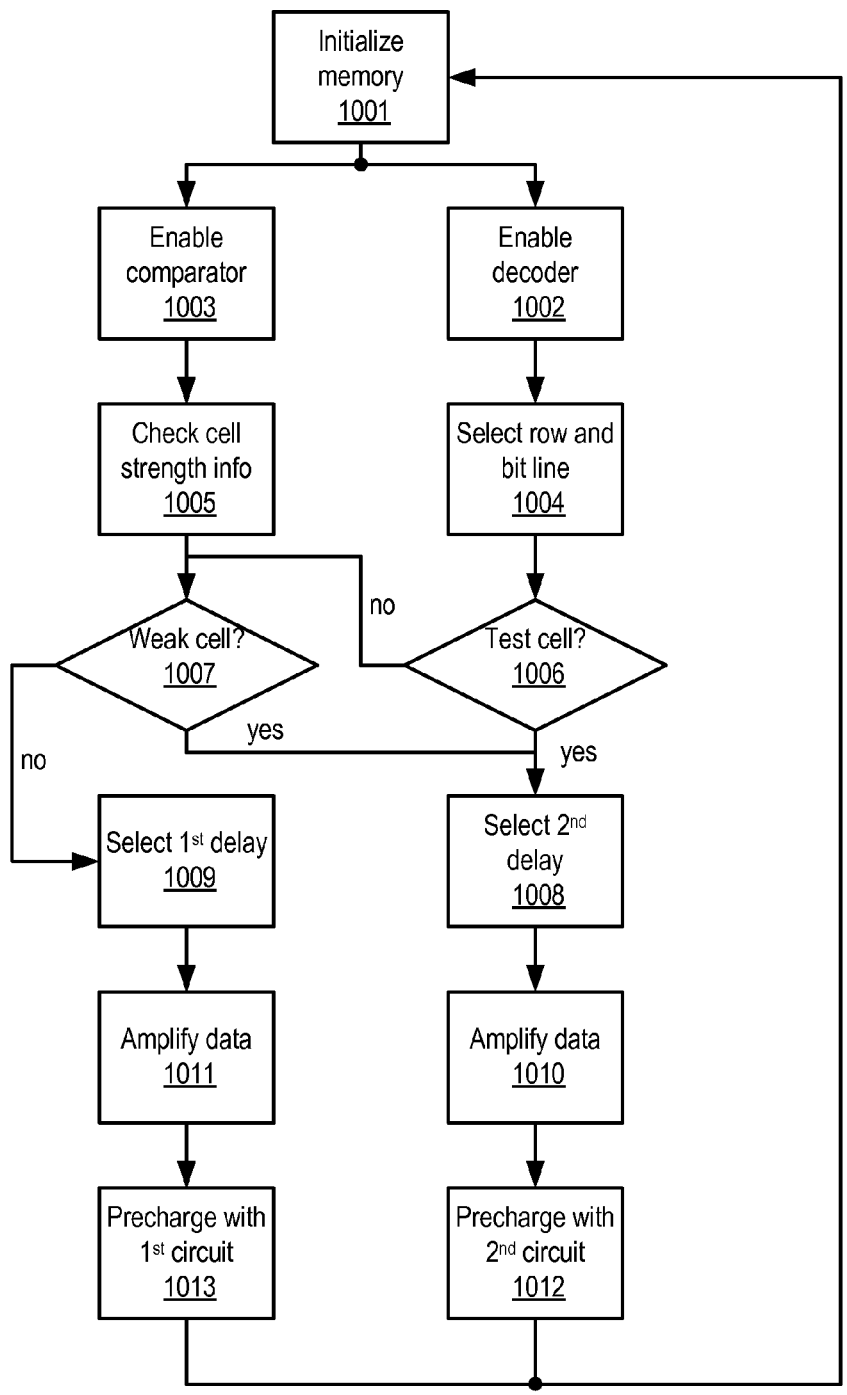
FIG. 10 illustrates a possible method of operating the embodiment illustrated in FIG. 7.

A possible method of operating memory 700 is illustrated in FIG. 10. Referring collectively to FIG. 7 and the flowchart illustrated in FIG. 10, the operation may start in block 1001 with the initialization of memory 700. A read cycle may start with the assertion of clk 710 which, in turn, may assert decoder enable 706, activating address decoder 703 (block 1002) and address comparator 704 (block 1003). Once enabled, address decoder 703 may decode the address presented to add 712 and may assert one of row selects 707 and one of column selects 708 (block 1004). Simultaneously, address comparator 704 checks the address presented on add 712 to determine if the presented address selects data storage cells that are weak (block 1005). The operation then depends on whether or not memory 700 is operating in test mode (block 1006). When memory 700 is operating in test mode, timing and control block 702 employs a secondary delay to generate an amplifier enable signal which may be included in control signals 705 (block 1008). After the secondary delay has elapsed from the assertion of decoder enable 706, timing and control block 702 may assert the amplifier enable signal causing sense amplifiers in sub-arrays 701a, 701b, and 701c to activate, amplify the data in the selected data storage cell within each sub-array, and couple the amplified data to dio 709 (block 1010). Timing and control unit 702 may then assert a second pre-charge signal which may be included in control signals 705 (block 1012), causing sub-arrays 701a, 701b, and 701c, to pre-charge with second pre-charge circuits, allowing memory 600 to re-initialize in preparation for another cycle (block 1001).

When memory 700 is not operating in test mode, the operation then depends on the result of the address comparison performed by address comparator 704 (block 1007). It is noted that since the address comparison was performed in parallel, the assertion of one of row selects 707 was not delayed. When the selected data storage cells have been previously identified as not being weak, misread indication signal 713 remains inactive, causing timing and control block 702 to use the default delay period to generate the amplifier enable signal (block 1009). When the time period of the default delay has elapsed, the amplifier enable signal may be asserted, and the sense amplifiers in sub-arrays 701a, 701b, and 701c, activate and amplify the data in the selected data storage cell within each sub-array, and couple the amplified data to dio 709 (block 1011). Timing and control unit 702 may then assert a first pre-charge signal which may be included in control signals 705 (block 1013), causing sub-arrays 701a, 701b, and 701c, to pre-charge with first pre-charge circuits, allowing memory 600 to re-initialize in preparation for another cycle (block 1001).

When one of the selected data storage cells in sub-array 701a, 701b, and 701c has been previously identified to be weak, misread indication signal 713 may be asserted causing timing and control block 702 to use a secondary delay period to generate the amplifier enable signal (block 1008). When the time period of the secondary delay has elapsed, the amplifier enable signal may be asserted, and the sense amplifiers in sub-arrays 701a, 701b, and 701c, activate and amplify the data in the selected data storage cell within each sub-array, and couple the amplified data to dio 709 (block 1010). Timing and control unit 702 may then assert the second pre-charge signal, causing sub-arrays 701a, 701b, and 701c, to pre-charge with the second pre-charge circuits, allowing memory 700 to re-initialize in preparation for another cycle (block 1001). It is noted that during actual circuit operation, some or all of the operations illustrated in FIG. 10 may occur in a different order, or may occur concurrently rather than sequentially.

Figure 11:
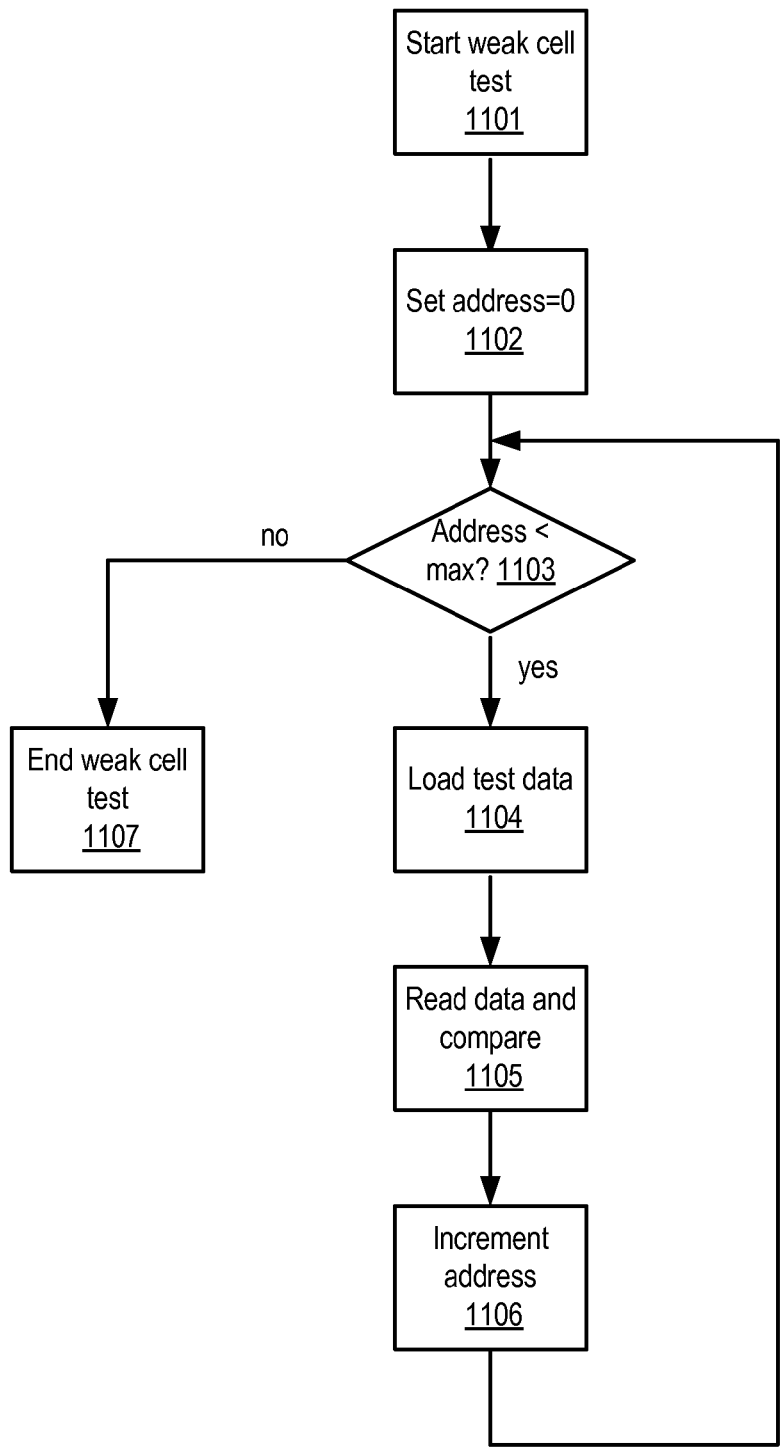
FIG. 11 illustrates a possible method of testing for weak data storage cells.

FIG. 11 illustrates a possible method of operating memory 700 to test for weak data storage cells. Referring collectively to FIG. 7 and the flowchart illustrated in FIG. 11, the operation starts in block 1101. The value presented to add 712 may be set to zero (block 1102). The operation then depends on the value presented to add 712. When the value presented to add 712 exceeds the maximum address of memory 700, the test may end (block 1107). When the value on add 712 is less than the maximum address of memory 700, mode 711 may be set for a write operation, test data may be presented to dio 709, and clk 110 may be asserted, writing the test data into the data storage cells selected by the value presented to add 712 (block 1104).

Once the test data has been loaded, memory 700 may be re-initialized. Mode 711 may be set for read and test operation and clk 110 may be asserted initiating the read and comparison operation as will be described in reference to FIG. 12 (block 1105). When the read and comparison operation has completed, memory 700 may be re-initialized and the value presented to add 712 may be incremented (block 1106) and the value checked against the maximum address for memory 700 (block 1103). It is noted that operations shown in FIG. 11 are merely an illustrative example and that in actual circuit operation, other operations and order of operations may be possible.

Figure 12:
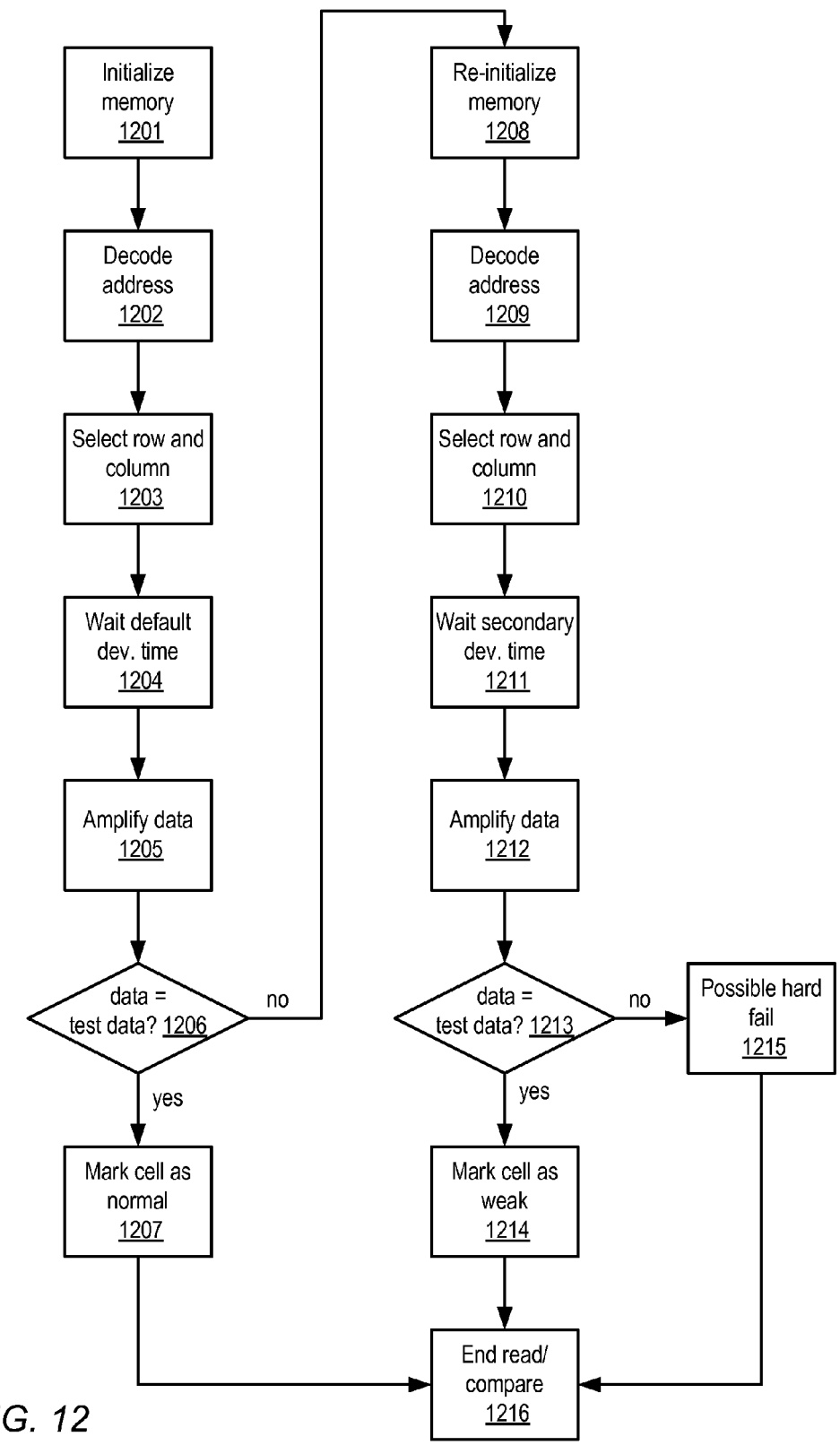
FIG. 12 illustrates a possible method of reading and comparing stored test data from data storage cells.

A possible method of operating memory 700 to read and compare previously loaded test data is illustrated in FIG. 12. Referring collectively to FIG. 7 and the flow chart illustrated in FIG. 12, the operation may begin by de-asserting clk 710 to initialize memory 700 (block 1201). Mode 711 may be set for normal read operation and clk 710 may be asserted which causes timing and control unit 702 to assert decoder enable signal 706. Address decoder 703 decodes the address presented on add 712 (block 1202) in response to the assertion of decoder enable signal 706, and asserts one of row selects 707 and one of column selects 708 (block 1203) selecting a data storage cell in each of sub-arrays 701*a*, 701*b*, and 701*c*. After the default delay (block 1204), timing and control unit 702 asserts the amplifier enable signal to activate the sense amplifiers in sub-arrays 701*a*, 701*b*, and 701*c*, causing the sense amplifiers to amplify the data from the selected data storage cells and couple the amplified data to dio 709 (block 1205).

The operation then depends on the value of data output on dio 709 (block 1206). When the data output on dio 709 matches the originally loaded test data, the current address may be noted as containing data storage cells of normal strength and the test of the data storage cells at the given address location may be completed (block 1216). When the data output on dio 709 does not match the originally loaded test data, clk 710 may be de-asserted and memory 700 may be re-initialized (block 1208). Mode 711 may be set for test read operation and clk 710 may be asserted. In response to the assertion of clk 710, timing and control unit 702 may assert decoder enable 706, causing address decoder 703 to decode the address presented on add 712 (block 1209). Address decoder 703 may then assert one of row selects 707 and one of column selects 708, selecting a data storage cell in each of the sub-arrays 701*a*, 701*b*, and 701*c* (block 1210). Timing and control unit 702 may then select the secondary delay (block 1211) before asserting the amplifier enable signal. After the secondary delay has elapsed, timing and control unit 702 may assert the amplifier enable signal to activate the sense amplifiers in sub-arrays 701*a*, 701*b*, and 701*c*, causing the sense amplifiers to amplify the data from the selected data storage cells and couple the amplified data to dio 709 (block 1212).

The newly-read value of the data on dio 709 is compared against the originally loaded test data (block 1213). When the data on dio 709 does not match the originally loaded test data, the selected data storage cells may contain one or more hard failures (block 1215). In this test flow, no further action is taken and the test of data storage cells at the current address location may be complete (block 1216). When the data on dio 709 matches the originally loaded test data, the current address may be noted as containing one or more weak data storage cells (block 1214). The test operation at the given address may then complete (block 1216). The method illustrated in FIG. 12 is exemplary. In other embodiments, some or all of the steps illustrated in FIG. 12 may occur in a different order or may occur concurrently.

Figure 13:
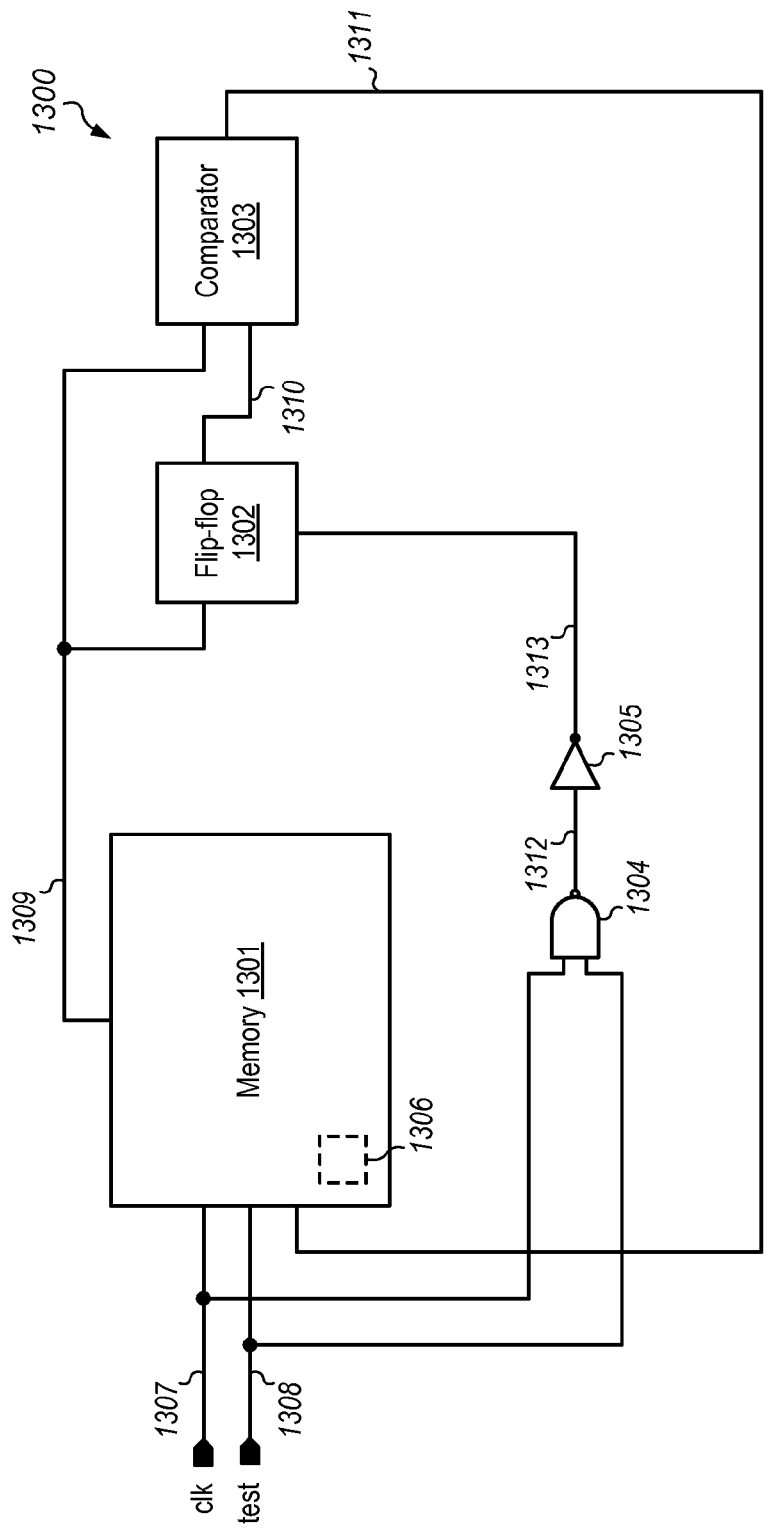
FIG. 13 illustrates an embodiment of a memory instance.

An embodiment of a memory system is illustrated in FIG. 13. In the illustrated embodiment, the system 1300 includes an instance of a memory 1301 that may incorporate some or all of the features described above with respect to memory 700. The illustrated embodiment also includes a flip-flop 1302, a comparator 1303, a NAND gate 1304, and an inverter 1305. In some embodiments, memory 1301 may include a storage unit 1306.

In the illustrated embodiment, clk 1307 and test 1308 are coupled to memory 1301 and to NAND gate 1304. Memory 1301 is coupled to flip-flop 1302 and comparator 1303 through node 1309, and NAND gate 1304 is coupled inverter 1305 through node 1312. Inverter 1305 is coupled to the control input of flip-flop 1302 through node 1313. The output of comparator 1303 is further coupled to memory 1301.

In some embodiments, flip-flop 1302 may be a "data" or "delay" flip-flop (D flip-flop) triggered on the rising edge of the flip-flop's control input. Flip-flop 1302 may require data to be captured be presented to the data input of flip-flop 1302 a time period before the control input is asserted (the time period is commonly referred to as the "setup time" of the flip-flop). In some embodiments, flip-flop 1302 may include various logic gates (e.g., NAND gates) coupled to provide the flip-flop state function. In other embodiments, flip-flop 1302 may include serially connected latches configured such that each latch operates on a different phase on the control input.

Comparator 1303 may, in some embodiments, be configured to perform a bitwise comparison between the output of memory 1031 and the output of flip-flop 1302. In some embodiments, comparator 1303 may include one or more static logic gates (e.g., NAND, NOR, etc.). In other embodiments, comparator 1303 may include one or more dynamic logic gates (e.g., dynamic exclusive-or (XOR)) to perform the comparison function.

During operation, memory 1301 may allow additional time for signal voltage on bit lines to develop. In some embodiments, the additional time provided for signal voltage development on the bit lines may cause a delay in the output of data from memory 1301. The delay in the output of data from memory 1301 may result in a violation of other circuits' (e.g., flip-flop 1302) setup time, resulting in a failure to capture the output data from memory 1301. Memory system 1300 may be operated to determine a maximum additional time for signal voltage development to ensure other circuits can capture data from memory 1301.

The characterization operation may require two clock cycles. During a first clock cycle, clk 1307 may be asserted and test 1308 may be set to select a first development time. Memory 1301 outputs data to node 1309 and comparator 1303 stores the data. During a second clock cycle, clk 1307 may again be asserted. NAND gate 1304 generates a low on node 1312 dependent on state of test 1308. In response to the low on node 1312, inverter 1305 generates a high on node 1313. Flip-flop 1302 then captures the data on node 1309 in response to the high on node 1313 and couples the data on node 1309 to node 1310. Comparator 1303 may then compare the data stored from the first clock cycle with the data on node 1310, and generate a comparison output on node 1311. The operation may then depend on the value of comparison output. When the data from the first clock cycle and the data on node 1310 matches, memory system 1300 may be able to tolerate additional signal voltage development time, and the characterization operation may be repeated with a longer signal voltage development time. When the data from the first clock cycle and the data on node 1310 does not match, memory system 1300 may have violated the setup time for flip-flop 1302 with the current signal voltage development time. The characterization operation may then be repeated with a shorter signal voltage development time. In some embodiments, the value of the comparison output on node 1311 may be stored in storage unit 1306.

Figure 14:
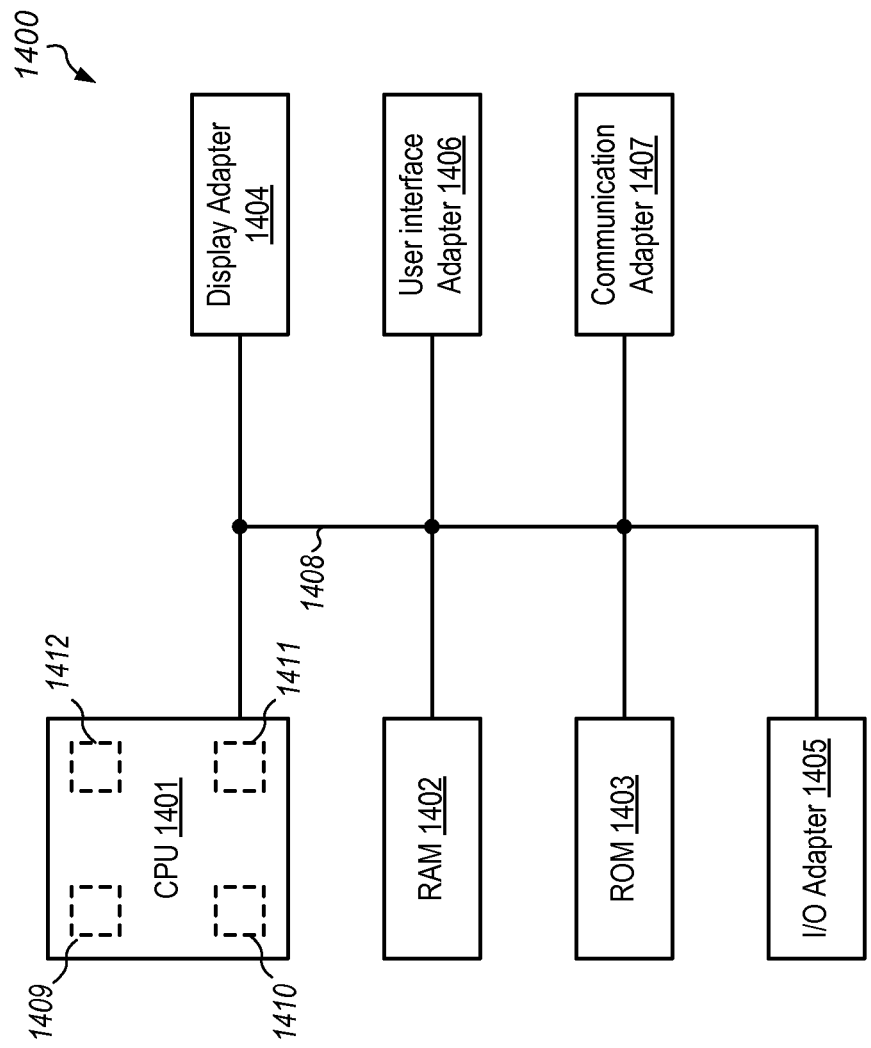
FIG. 14 illustrates an embodiment of a computing system.

Turning now to FIG. 14, a block diagram of a system is illustrated. In the illustrated embodiment, the system 1400 includes an instance of a random access memory (RAM) 1402 and a read-only memory (ROM) 1403 each of which each may include one or more sub-arrays that may incorporate some or all of the features described above with respect to memory 700.

The illustrated embodiment also includes a CPU 1401, which may implement any suitable instruction set architecture (ISA), such as, e.g., the ARM™, PowerPCT™, or x86 ISAs, or combination thereof. CPU 1401 may include one or more local storage units 1409. For example, CPU 1401 may include a Cache Data RAM, a Tag RAM, one or more register files, and one or more FIFOs. Each one of the local storage units 1409 may incorporate some or all of the features of memory 700. In some embodiments, CPU 1401 may include test circuitry 1411 configured to operate the enable generator circuits within each local storage unit, and a storage unit 1410 configured to store the address location of weak data storage cells. In other embodiments, CPU 1401 may include memory management unit 1412 configured to generate timing selection signals for local storage units 1409. Additionally, the illustrated embodiment includes an I/O adapter 1405, a display adapter 1404, a user interface adapter 1406, and a communication adapter 1407.

Numerous variations and modifications will become apparent to those skilled in the art once the above disclosure is fully appreciated. It is intended that the following claims be interpreted to embrace all such variations and modifications.

What is claimed is:

1. An apparatus, comprising:
   a plurality of columns, wherein each of the plurality of columns includes a respective plurality of data storage cells and a respective pre-charge circuit;
      wherein each given one of the plurality of data storage cells is configured such that in response to the assertion of a respective one of a plurality of row selection signals, the given data storage cell generates a corresponding column output; and
      wherein the pre-charge circuit is configured to selectively provide a first pre-charge current or a second pre-charge current dependent upon a pre-charge control signal;
   a column multiplexer coupled to receive input data from column outputs of the plurality of columns, wherein the column multiplexer is configured to controllably select input data from the plurality of columns dependent upon a column selection signal to generate a column multiplexer output;
   a sense amplifier configured to amplify the column multiplexer output by a gain level of the sense amplifier in response to assertion of an amplifier enable signal;
   a selection circuit configured to generate the plurality of row selection signals and the plurality of column selection signals dependent upon an input address and in response to the assertion of a selection enable signal; and
   a timing and control unit configured to generate the pre-charge control signal and the selection enable signal;
   wherein the timing and control unit is further configured to selectively generate the amplifier enable signal either a first time period or a second time period after generation of the selection enable signal, dependent upon a timing selection signal, wherein the timing selection signal is dependent upon a read current of at least one data storage cell of the plurality of data storage cells.

2. The apparatus of claim 1, wherein the timing and control unit includes a variable delay line configured to selectively provide the first time period or the second time period dependent upon the timing selection signal.

3. The apparatus of claim 1, wherein the timing and control unit includes a first delay line configured to provide the first time period and a second delay line configured to provide the second time period.

4. The apparatus of claim 1, wherein the timing and control unit is further configured such that the pre-charge control signal is dependent upon the timing selection signal.

5. A method comprising:
   detecting cell strength for a particular one of a plurality of data storage cells, wherein each given one of the plurality of data storage cells is configured to output data in response to assertion of a respective one of a plurality of selection signals, wherein the cell strength is dependent upon a read current of the particular one of the plurality of data storage cells;
   generating a timing selection signal that is dependent upon the cell strength, such that the timing selection signal is further dependent upon the read current of the particular one of the plurality of data storage cells;
   selectively reading data from the particular one of the plurality of data storage cells using a first signal development time or a second signal development time dependent upon the timing selection signal; and
   selectively pre-charging the particular one of the plurality of data storage cells using a first pre-charge current or a second pre-charge current dependent upon the timing selection signal.

6. The method of claim 5, further comprising:
   storing the cell strength information indicative of the detected cell strength; and
   reading the stored cell strength information during address decode.

7. The method of claim 5, further comprising:
   reading data from the particular one of the plurality of data storage cells using the second signal development time in response to determining that the read cell strength information is indicative of a weak data storage cell, wherein the second signal development time is longer than the first signal development time.

8. The method of claim 7, further comprising:
   storing test data in the particular one of the plurality of data storage cells;
   reading the test data from the particular one of the plurality of data storage cells using the first signal development time to generate a first data output;
   reading the test data from the particular one of the plurality of data storage cells using the second signal development time to generate a second data output; and
   comparing the first data output and the second data output to detect the cell strength.

9. An apparatus, comprising:
   a plurality of data storage cells, wherein each given one of the plurality of data storage cells is configured to output data in response to the assertion of a respective one of a plurality of selection signals;

a sense amplifier configured to amplify the data from a selected one of the plurality of data storage cells, wherein amplification of the data selectively occurs a first time period after assertion of the respective selection signal or a second time period after the assertion of the respective selection signal dependent upon a timing selection signal; and wherein the timing selection signal is dependent upon a read current of the selected one of the plurality of data storage cells;

a pre-charge circuit coupled to the input of the sense amplifier and configured to selectively provide a first pre-charge current or a second pre-charge current dependent upon the timing selection signal.

10. The apparatus of claim 9, wherein the timing selection signal is further dependent upon a test mode signal.

11. The apparatus of claim 9, wherein the second time period is longer than the first time period.

12. The apparatus of claim 10, wherein the timing selection signal selects the second time period in response to a determination that the selected one of the plurality of data storage cells is weak.

13. A memory circuit, comprising:
a timing and control unit;
an address decoder; and
a plurality of sub-arrays;
wherein each of the sub-arrays comprises:
 a plurality of columns;
 a column multiplexer; and
 a sense amplifier;
 wherein each of the columns comprises:
  a plurality of data storage cells, wherein each given one of the data storage cells is configured such that in response to assertion of a respective one of a plurality of row selection signals, the given data storage cell generates a corresponding column output; and
  a pre-charge circuit configured to selectively provide a first pre-charge current or a second pre-charge current dependent upon a pre-charge control signal;
 wherein the column multiplexer is coupled to receive input data from column outputs of the plurality of columns, wherein the column multiplexer is configured to controllably select the output from the plurality of columns in response to assertion of a respective one of a plurality of column selection signals; and
 wherein the sense amplifier is configured to receive input data from the column multiplexer such that in response to assertion of an amplifier enable signal, the sense amplifier outputs the input data amplified by a gain of the sense amplifier; and
wherein the address decoder is configured to receive an input address such that in response to a decoder enable signal, the address decoder asserts one of the plurality of row selection signals and one of the plurality of column selection signals; and
wherein the timing and control unit is configured to generate the pre-charge control signal and the decoder enable signal;
wherein the timing and control unit is further configured to selectively generate the amplifier enable signal either a first time period or a second time period after generation of the decoder enable signal, dependent upon a timing selection signal;
wherein the timing selection signal is dependent upon a read current of at least one data storage cell.

14. The memory circuit of claim 13, wherein the timing and control unit includes a variable delay line configured to selectively provide the first time period and the second time period dependent upon the timing selection signal.

15. The memory circuit of claim 13, wherein the second time period is larger than the first time period.

16. The memory circuit of claim 15, wherein the address decoder includes a storage array and a comparator, wherein the comparator is configured to activate the timing selection signal to select the second time period in response to determining that the input address matches an entry in the storage array.

17. A system, comprising:
one or more memories; and
a processing unit, wherein the processing unit comprises:
 a memory management unit configured to generate a selection enable signal, wherein the memory management unit is further configured to selectively generate an amplifier enable signal either a first time period or a second time period after generation of the selection enable signal, dependent upon a timing selection signal;
 one or more storage arrays, wherein each of the storage arrays comprises:
  a plurality of data storage cells wherein each given one of the plurality of data storage cells is configured to output data in response to the assertion of a respective one of a plurality of selection signals;
  a selection circuit configured to assert one of the plurality of selection signals in response to the assertion of a selection enable signal; and
  a sense amplifier configured to receive input data from a selected one of the plurality of data storage cells such that, in response to the assertion of the amplifier enable signal, the sense amplifier outputs the input data amplified by a gain level of the sense amplifier;
wherein the timing selection signal is dependent upon a read current of the selected one of the plurality of data storage cells;
wherein the processing unit further comprises:
 one or more test flip-flops configured to receive data from one or more the storage arrays and further configured to generate a flip-flop output in response to the assertion of a test clock; and
 one or more comparators configured to compare data from one or more of the storage arrays to the flip-flop output.

18. The system of claim 17, wherein the memory management unit includes a test unit configured to generate the timing selection signal.

19. The system of claim 17, wherein the second time period is longer than the first time period.

20. The system of claim 19, wherein the memory management unit is further configured to generate the amplifier enable the second time period after the generation of the selection enable signal, in response to determining that the selection circuit selected a weak data storage cell.

* * * * *